(12) United States Patent
Meharry

(10) Patent No.: US 7,847,653 B2
(45) Date of Patent: *Dec. 7, 2010

(54) WIDE BANDWIDTH MICROWAVE BALUN

(75) Inventor: David E. Meharry, Lexington, MA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 0 days.

This patent is subject to a terminal disclaimer.

(21) Appl. No.: 12/454,456

(22) Filed: May 18, 2009

(65) Prior Publication Data

US 2009/0224846 A1 Sep. 10, 2009

Related U.S. Application Data

(63) Continuation of application No. 11/715,705, filed on Mar. 8, 2007, now Pat. No. 7,557,673.

(51) Int. Cl.
*H03H 7/42* (2006.01)
*H03H 7/46* (2006.01)

(52) U.S. Cl. .......................... 333/25; 333/132

(58) Field of Classification Search ............ 333/25, 333/26, 132
See application file for complete search history.

(56) References Cited

U.S. PATENT DOCUMENTS

| | | | |
|---|---|---|---|
| 4,397,037 A | 8/1983 | Theriault | |
| 6,683,510 B1 | 1/2004 | Padilla | |
| 7,242,245 B2 * | 7/2007 | Burns et al. ............ | 330/124 R |
| 7,242,268 B2 | 7/2007 | Hagiwara et al. | |

OTHER PUBLICATIONS

Maas, Nonlinear Microwave Circuits, Artech House Inc., Norwood, MA, 1988, pp. 226-231 & pp. 240-243.

Cripps, Advanced Techniques In RF Power Amplifier Design, Artech House Inc., Norwood, MA, 2002, pp. 272-279.

Meharry et al., Broad Bandwidth Transformer Coupled Differential Amplifiers For High Dynamic Range, IEEE Journal of Solid-State Circuits, vol. 34, No. 9, Sep. 1999, pp. 1233-1238.

Oltman, The Compensated Balun, IEEE Transactions on Microwave Theory and Techniques, vol. MTT-14, No. 3, Mar. 1966, pp. 112-119.

Tsai, A New Compact Wideband Balun, IEEE Microwave and Millimeter-Wave Monolithic Circuits Symposium, 1993, pp. 123-124.

Yoon et al., A Silicon Monolithic Spiral Transmission Line Balun With Symmetrical Design, IEEE Electron Device Letters, vol. 20, No. 4, Apr. 1999, pp. 182-184.

Pavio et al., A Monolithic Or Hybrid Broadband Compensated Balun, IEEE MTT-S Digest, 1990, pp. 483-486.

Barber, Enhanced Coupled, Even Mode Terminated Baluns And Mixers Constructed Therefrom, IEEE MTT-S Digest, 1990, pp. 495-498.

(Continued)

*Primary Examiner*—Dean O Takaoka
(74) *Attorney, Agent, or Firm*—Robert K. Tendler

(57) ABSTRACT

A wide bandwidth microwave balun utilizes frequency band splitting and two conventional baluns operating in a high frequency band and a low frequency band, which when combined offer a full bandwidth output, thus to offer wide bandwidth impedance matching and second-harmonic rejection.

21 Claims, 9 Drawing Sheets

OTHER PUBLICATIONS

Minnis et al., New Broadband Balun Structures For Monolithic Microwave Integrated Circuits, IEEE MTT-S Digest, 1991, pp. 425-428.

Gu et al., Broadband Design Consideration Of Uniplanar Double-Y Baluns For Hybrid And Monolithic Integrated Circuits, IEEE, 1999 (4 unnumbered pages).

Collin, Foundations For Microwave Engneering, McGraw-Hill Book Company, 1966, pp. 172-176, Kogakusha Company, Ltd., Tokyo, Japan.

Marchand, Transmission-Line Conversion Transformers, Electronics, Dec. 1944, pp. 142-145, McGraw-Hill Publishing Company, NY.

\* cited by examiner

WIDE BANDWIDTH MICROWAVE BALUN

RELATED APPLICATIONS

This is a continuation of patent application Ser. No. 11/715,705 filed Mar. 8, 2007 now U.S. Pat. No. 7,557,673 entitled Wide Bandwidth Microwave Balun, the contents of which are incorporated herein by reference.

STATEMENT OF GOVERNMENT INTEREST

This invention was made with United States Government support under a classified contract. The United States Government has certain rights in this invention.

FIELD OF THE INVENTION

This invention relates to microwave and RF circuits and more particularly to baluns used in such circuits.

BACKGROUND OF THE INVENTION

An essential component in many microwave and RF circuits is the balanced to unbalanced transformer or balun. Balun applications include balanced mixers, multipliers, and amplifiers for cancellation of even order intermodulation products, power amplifiers for push-pull power combining, and for the connection of naturally balanced antenna structures to unbalanced microwave components.

Low frequency baluns leverage ferrite and air coil transformer technology to achieve high performance and very broad bandwidth. However, at microwave frequencies it becomes increasingly difficult to fabricate this class of balun and other techniques become necessary. Miniaturization of the balun to a size and planar form compatible with monolithic microwave integrated circuit, MMIC, fabrication further complicates the design and implementation of the balun.

Due to the unavailability of ferrite technology to provide for ultrawide bandwidth baluns, there is a need to provide other types of technology to achieve a 10:1 frequency bandwidth such as between 2 Gigahertz and 20 Gigahertz. Uses for such wide bandwidth baluns include microwave surveillance applications where wideband frequency coverage is required to be able to detect the large variety of signals that pop up, as well as to provide interface circuitry for wideband digital signals and wideband antenna structures.

In general, in the basic operation of a balun, balanced signals that come out of the balun from an unbalanced line input are equal in amplitude and 180 degrees opposite in phase. Thus, for instance, signals that come in on an unbalanced 50-Ohm line may be converted to signals applied to a balanced 300-Ohm line.

One of the main purposes of baluns other than for impedance matching is for the cancellation of second-order distortion of which second harmonics is a part. As such, such baluns can be used for balanced mixers so that when a signal comes into the single-ended input of the mixer, it comes out split into a different kind of signal.

The balun can be used with differential amplifiers or pairs of amplifiers that connect to an antenna, with the balun being used for combining the output of the differential amplifier so that it does not lose half of its power into a termination.

While it is known to cancel second-order distortion in the front ends of amplifiers and to do so in the microwave region of the electromagnetic spectrum, the problem is that in an amplifier, to cancel second harmonics the balun has to be operating from the lowest input frequency to twice the highest output frequency. Thus, if one has an amplifier that operates for instance between 1 and 5 Gigahertz, the balun would have to operate between 1 to 10 Gigahertz to cancel the second harmonics.

Note that harmonics and other non-linearities in an amplifier create distortion in which harmonics constitute one form of distortion. Other forms of distortion can be intermodulation products, and the mixing of two signals that creates spurious tones at the sum and difference frequencies. These are all second-order products that need to be canceled. The cancellation of spurious tones using second harmonic cancellation is the operating province of balanced mixers that help to cancel these tones.

Moreover, it is noted that in a receiver, a receiver would have to be able to deal with every single spurious tone that would appear at the output of its pre-amplifier. It is noted that in an amplifier of bandwidth greater than an octave, the highest-power distortion tones are usually the second order tones The effect of such distortion can be seen as follows. If one is operating near a radio station and one happens to be listening to a weaker station further away, the presence of the large signal from the nearby radio station can create spurious tones due to the above-mentioned non-linearities in an amplifier. This makes it virtually impossible or very difficult to receive the signal that one is interested in with good fidelity.

Priorly, in order to reduce the second-order distortion, a brute-force approach has been employed. By increasing the power handling capability of the amplifier, it becomes more linear for a given signal level. Thus, second-order distortions were kept to a minimum by increasing the power handling capability of the amplifier and operating it at reduced input signal levels.

However, this is not an acceptable approach, especially in cases where one wants to use battery-powered devices or if one wishes to have a number of these amplifiers located in a small space, such as in a phased array.

While the technique of using a balun for second-order distortion cancellation is a known technique, there has been no ability to apply the balun to the kinds of frequency bandwidths that are required in signal intelligence applications because baluns do not typically have a 10:1 bandwidth ratio in the microwave region of the spectrum.

While it is possible in the HF region of the electromagnetic spectrum to broaden the bandwidth of the balun through the use of ferrites, normal ferrites do not work at microwave frequencies. While in the past microwave ferrites have been developed, they do not operate with a low enough loss to achieve the required bandwidths.

SUMMARY OF INVENTION

In order to provide a microwave balun with a 10:1 bandwidth, in the subject invention one divides the incoming signal into high frequency and low frequency bands. One then utilizes two different baluns, one with a low frequency band output and one with a high frequency band output, with the outputs of these two baluns being combined to give a full bandwidth signal.

As a result, when the outputs are combined, one has retained the balun functionality over effectively twice the geometric bandwidth i.e., over the combined bandwidth of the constituent baluns.

In one embodiment, two baluns and three diplexers are utilized. The diplexer functions as a filter device that has one input and two outputs. A signal coming into a diplexer at all the frequencies above the center frequencies will go out one path; and all frequencies below the center frequency will go out another path. Thus one is able to split an incoming signal into a high frequency band and a low frequency band utilizing a diplexer.

Having split the incoming signal into two frequency bands, one high and one low, the low frequency band is fed to a low frequency balun and the high frequency band is coupled to a high frequency balun. Thereafter, diplexer filters are used to combine the signals from the two baluns at the output for the full bandwidth response.

Note that the balun is a passive circuit that operates in either direction such that one can go from a balanced input to an unbalanced input and vice versa.

In operation, the desired amplified signals at the balanced outputs of the amplifier are equal in amplitude are 180 degrees out of phase. In contrast, unwanted or spurious signals, such as second order intermodulation distortion signals, are approximately in phase at the balanced output ports of the amplifier. Since the intermodulation distortion signals are in phase on both output ports of the amplifier, ideally no current flows in the balun responsive to these signals. In this way, the balun effectively suppresses or eliminates these signals to thereby provide a high level of rejection of the second order intermodulation distortion signals.

The net result is that by using a wide bandwidth microwave balun at an appropriate point in a circuit, second-order distortions can be canceled. In the subject invention the second-order distortion over a 10:1 frequency range, for instance between 2 Gigahertz and 20 Gigahertz can be canceled.

In summary, a wide bandwidth microwave balun utilizes frequency band splitting and two conventional baluns operating in a high frequency band and a low frequency band, which when combined offer a full bandwidth output, thus to offer wide bandwidth impedance matching and second-harmonic rejection.

BRIEF DESCRIPTION OF THE DRAWINGS

These and other features of the subject invention will be better understood in connection with the Detailed Description, in conjunction with the Drawings, of which.

DETAILED DESCRIPTION

Figure 1:
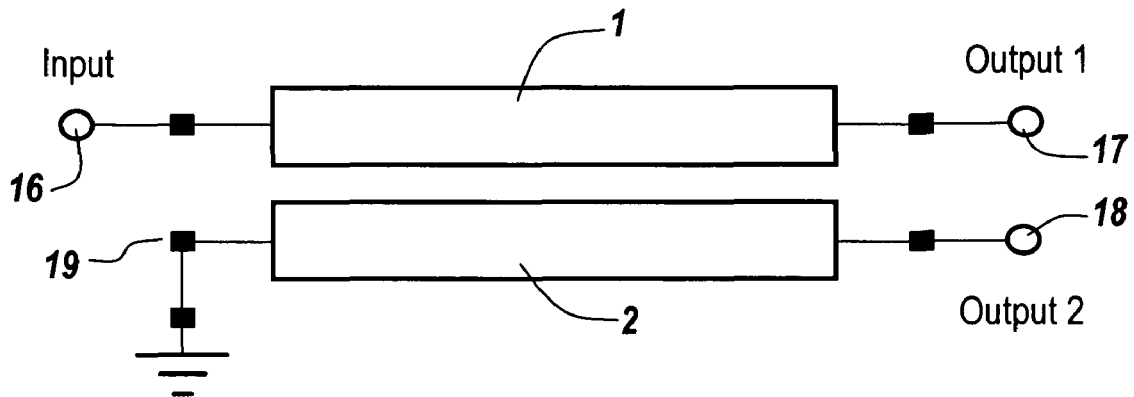
FIG. 1 is a block diagram of a simple conventional balun using coupled lines in which the bandwidth for this circuit is approximately 1 octave centered on the quarter-wave frequency of the coupled lines.

Referring now to FIG. 1, the design of the subject bal-plex balun begins with the design of the individual upper and lower band baluns. It is noted that the frequency bands must overlap enough to allow a smooth transition and a smooth frequency response, but not so much as to lose the frequency response at the highest and lowest frequencies.

Referring now to FIG. 1, one type of simple conventional balun uses coupled lines 1 and 2. The bandwidth for this circuit is approximately one octave centered on the quarter-wave frequency of the coupled lines. Note that as will be described later, the input to the balun is unbalanced across terminals 16 and 19, with terminal 19 grounded, whereas the balanced output is available across terminals 17 and 18.

Figure 2:
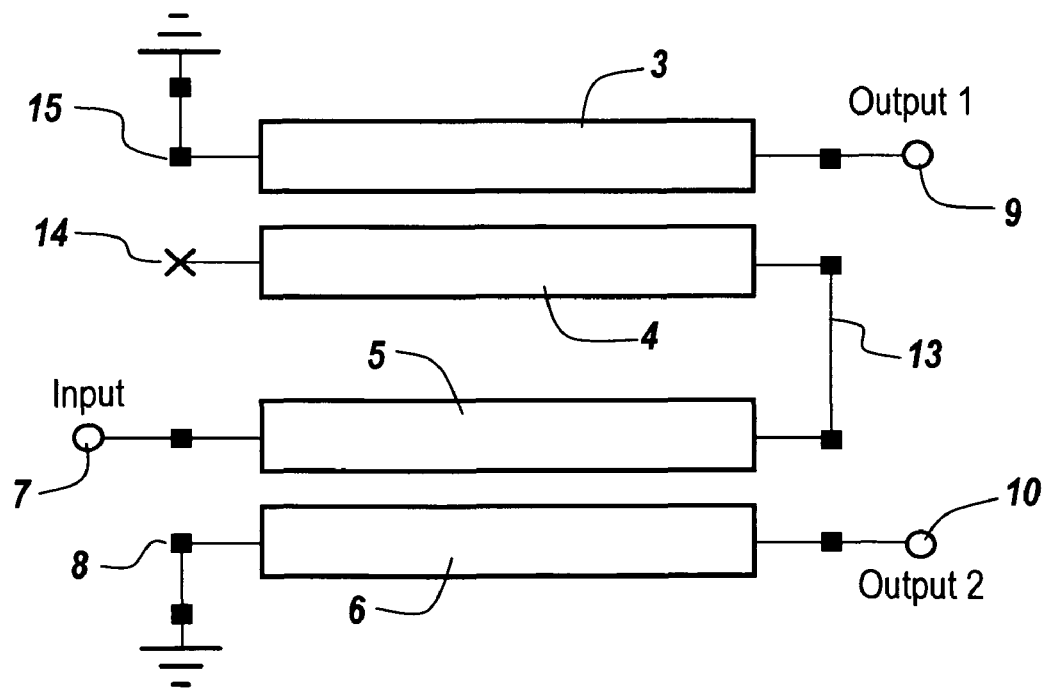
FIG. 2 is a block diagram of a compensated conventional Marchand balun having a bandwidth approaching 4:1.

Referring to FIG. 2, a compensated balun is shown whose architecture is used for the low frequency band balun of the subject invention. This compensated balun is illustrated as having coupled lines 3 and 4 and coupled lines 5 and 6. Here the unbalanced input is between input terminals 7 and 8, with terminal 8 grounded, to lines 5 and 6. The balanced output is available at terminals 9 and 10. It is noted that line 4 is coupled to line 5 at 13, with line 4 being open circuit terminated as illustrated at 14. While line 6 is grounded at terminal 8, line 3 is terminated at 14.

The balun bandwidth for the FIG. 2 circuit approaches 4:1 and is a member of the class of compensated baluns described by H. G. Oltman, Jr., "The Compensated Balun," IEEE Transactions In Microwave Theory and Techniques, MTT-14, pp. 112-119, 1966. One this type of compensated balun is the well-known Marchand balun. It is this balun configuration that in a spiral coupled line balun configuration establishes a low frequency band balun, and in an ordinary configuration establishes the high frequency band balun.

Figure 3A:
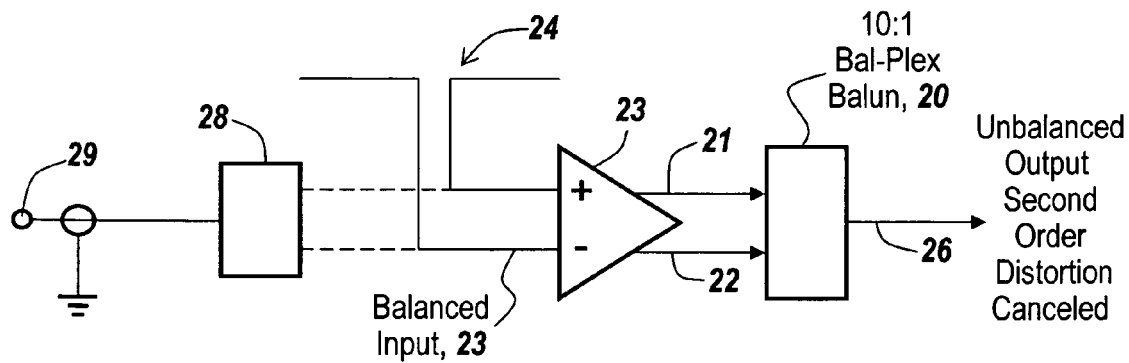
FIGS. 3A and 3B show respectively a balanced-to-unbalanced configuration utilizing the subject balanced diplexer bal-plex balun, and an unbalanced-to-balanced configuration.

Referring to FIG. 3A, it is possible to achieve a full bandwidth unbalanced output that cancels second-order distortions from an unbalanced input using the subject balun, here called a bal-plex balun 20. In this embodiment the bal-plex balun is fed by a balanced input on lines 21 and 22 from a differential amplifier 23 having a balanced input from for instance an antenna 24. Here the unbalanced output of the bal-plex balun is shown at 26.

Alternatively, the balanced input for the bal-plex balun 20 can be achieved by coupling the output of a balun 28 supplied with an unbalanced input 29 to the differential amplifier inputs.

Figure 3B:
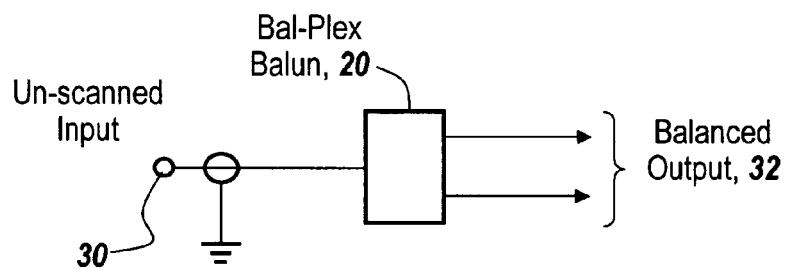

Alternatively as illustrated in FIG. 3B, an unbalanced input 30 may be coupled to the input of the subject bal-plex balun 20 to provide a balanced output 32 for connection to the inputs of a balanced amplifier, differential circuit, or broad band antenna.

Figure 4A:
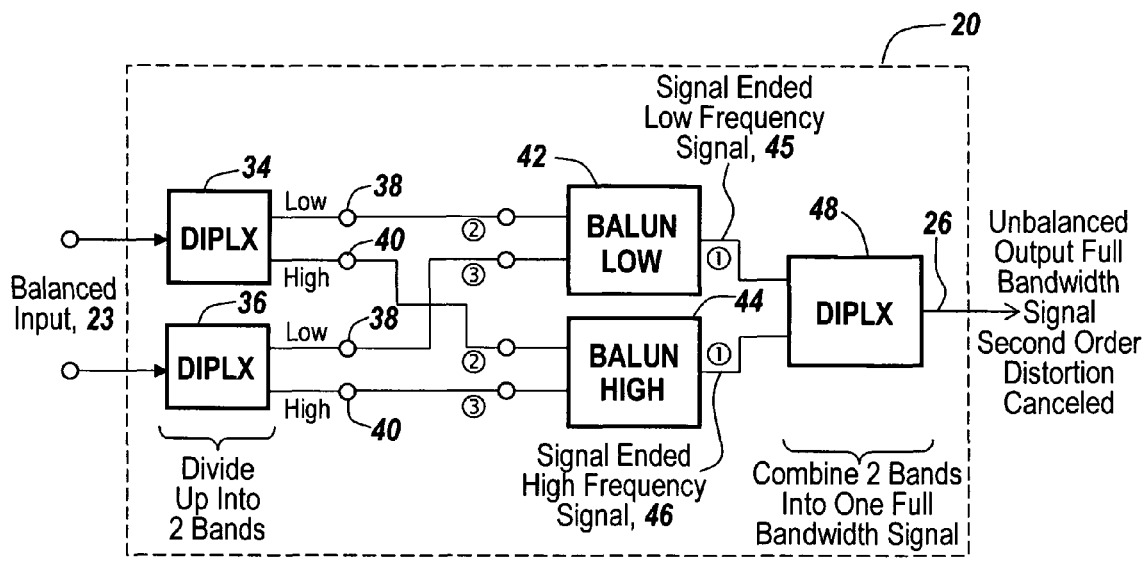
FIG. 4A is a block diagram of the bal-plex balun of FIG. 3A, showing the use of a pair of diplexers for separating the high and low bandwidth components of a balanced input that are coupled to respective high and low frequency band baluns, the outputs of which combine into one full bandwidth signal with second-order distortions canceled.

Referring now to FIG. 4A, having a balanced input at 23, the high frequency and low frequency bands are separated using diplexers 34 and 36, each of which divide up the incoming signal into a low frequency band component 38 and a high frequency band component 40.

As can be seen, low frequency band components from diplexers 34 and 36 are applied to a low frequency band balun 42, whereas the high frequency components from each of the diplexers are applied to the inputs of a high frequency band balun 44.

The output of the low frequency band balun 42 is a single-ended low frequency signal 45, whereas the output of the high frequency band balun is a single-ended high frequency signal 46. These single-ended low frequency and high frequency signals are applied to a diplexer 48, which combines the outputs of baluns 42 and 44 to supply the full bandwidth unbalanced output. Thus the bal-plex balun 20 of FIG. 3A in one embodiment is configured as illustrated in 4A.

Figure 4B:
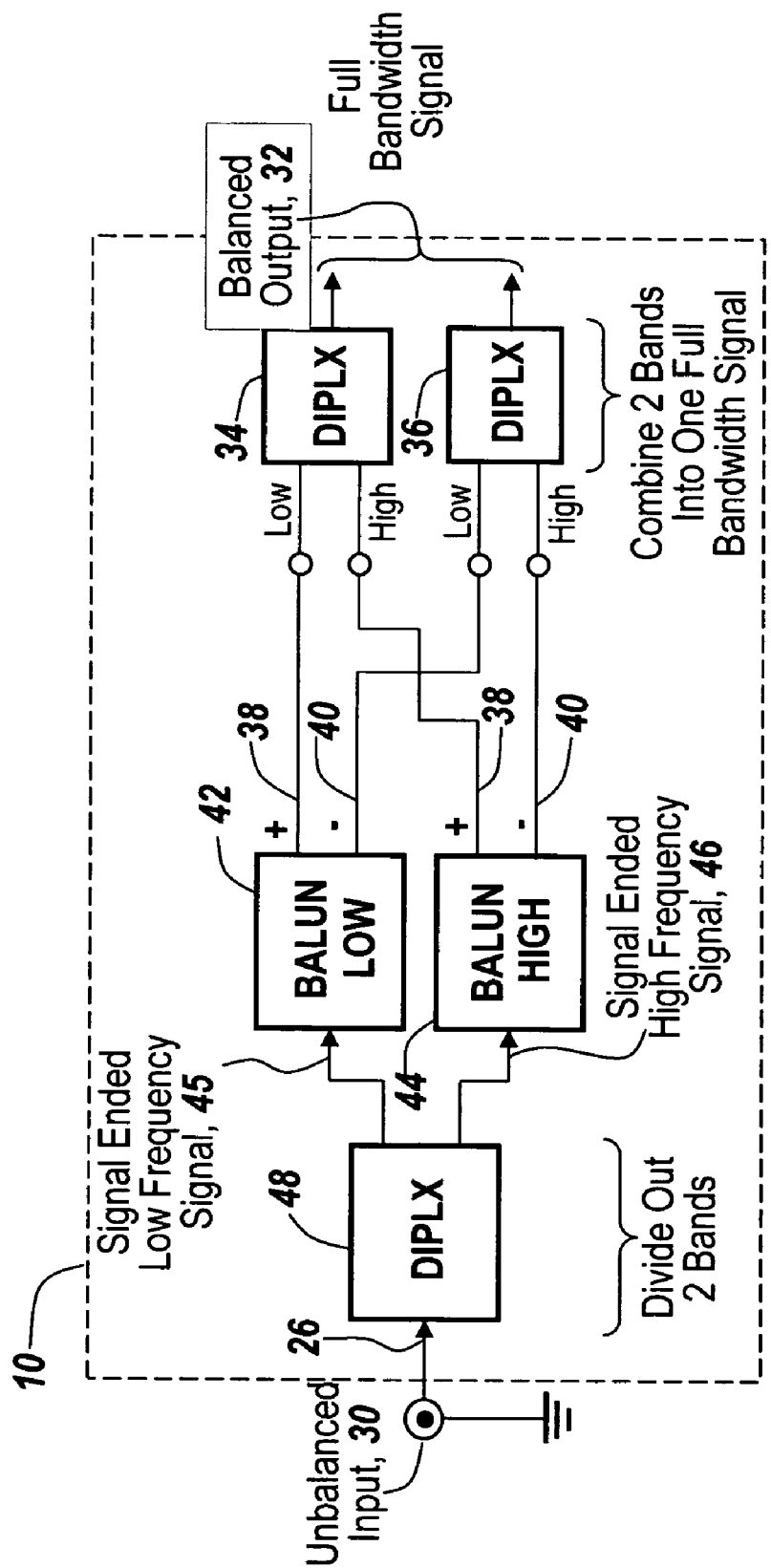
FIG. 4B is a block diagram of the bal-plex balun of FIG. 3B, indicating an unbalanced input separated out into two different frequency bands applied to a low frequency band balun and high frequency band balun respectively, with the outputs combined by a pair of diplexers into a balanced output, full bandwidth signal.

Alternatively, when operated in the reverse direction to convert an unbalanced input to a balanced output and as illustrated in FIG. 4B, unbalanced input 30 is applied to diplexer 48, which divides up the unbalanced input signal into a single-ended low frequency signal 45 and a single-ended high frequency signal 46. The outputs of the low frequency and high frequency band baluns 42 and 44 have low frequency and high frequency components 38 and 40 coupled to the respective low frequency and high frequency inputs to diplexers 34 and 36. These diplexers combine the outputs of baluns 42 and 44 into a full bandwidth balanced output signal 32.

What is accomplished is to divide up an unbalanced input into upper and lower frequency bands, provide the balun function for these two bands and combine them in one direction to provide a double bandwidth output; or to take a balanced input, dividing it up into the low and high frequency bands and apply them to the low frequency band and high frequency band baluns, after which the balun outputs are combined into a double bandwidth unbalanced output.

The double bandwidth provides the 10:1 ratio such that for microwave frequencies the bal-plex balun can operate from 2-20 GHz. The subject invention in one embodiment is a planar MMIC balun that has excellent performance over this decade bandwidth of 2 to 20 GHz. This very wide performance bandwidth is achieved with the combining of a 2 to 7 GHz spiral coupled line balun and a 6 to 20 GHz coupled line balun. These two compensated baluns are combined with each other using diplexer or other high pass-low pass filters to achieve the overall bandwidth. In one embodiment, the diplexers are further simplified with the absorption of filter elements into the balun input and output impedances.

Figure 5:
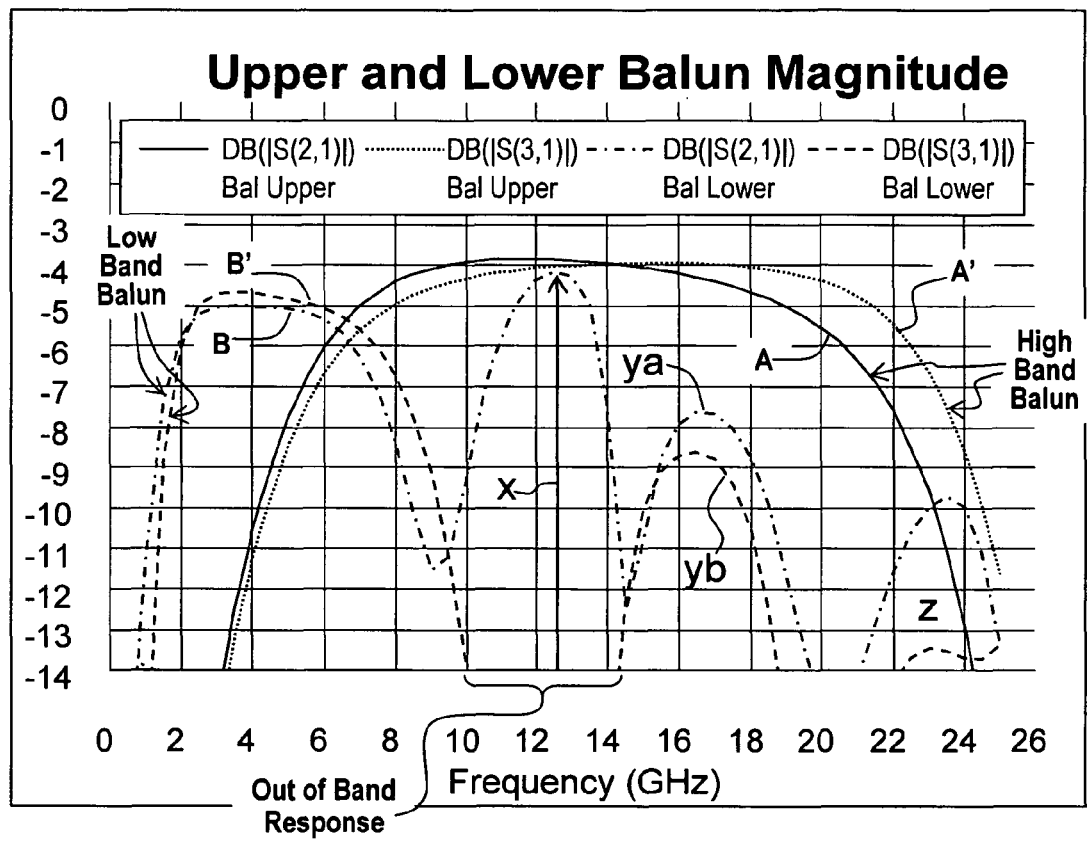
FIG. 5 is a graph of the amplitude response of the upper and lower frequency band baluns of FIG. 4B, showing a relatively smooth response for the upper frequency band balun but a characteristic for the lower frequency band balun in which there is an out-of-band response.

Referring now to FIG. 5, the pass band for the bal-plex balun, which incorporates the combined high band balun outputs and low band balun outputs, is illustrated in terms of the amplitude or the magnitude transfer function for the balun.

For the high band baluns, it is very clear that the pass band from 6 Gigahertz up through 20 Gigahertz is relatively flat. From FIG. 4A it is noted that the output terminal for the high and low frequency baluns is labeled 1, whereas their input terminals are respectively 2 and 3.

For the high-frequency band, the response is illustrated by curves A and A'. This shows a relatively flat response over the 3.5:1 bandwidth.

For the low frequency band, the response is illustrated by curves B and B'. It will be appreciated from the curves in FIG. 5 that what is shown is the main pass band for the low frequency band baluns. However, there is an out-of-band response that is undesirable. Note, there is an out-of-band response peak X due to a peak at 12.5 GHz. These artifacts are illustrated by peaks X, peaks $Y_a$ and $Y_b$, and peak Z.

It can be shown that this undesirable result can be eliminated by having a diplexer of sufficient selectivity that the responses shown in FIG. 5 are filtered out. Thus if one chooses the diplexers with appropriate frequency responses, one can eliminate the out-of-band artifacts.

Figure 6:
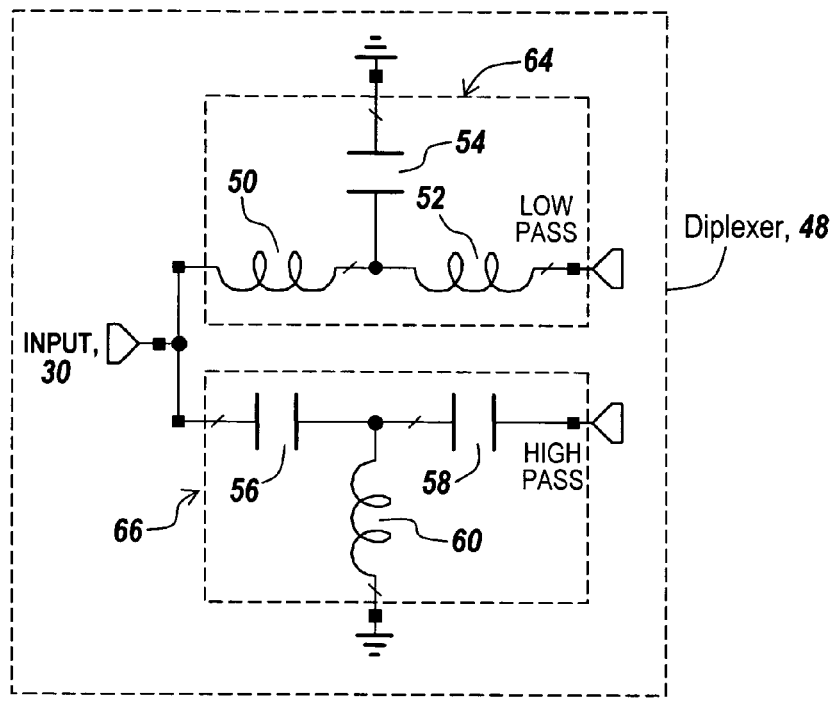
FIG. 6 is a schematic diagram of a diplexer for use as the input diplexer in the FIG. 4B bal-plex balun.

Referring now to FIG. 6, what is shown is an equivalent circuit for a diplexer, for instance diplexer 48, showing ideal inductors and capacitors for the simplest type of diplexer circuit.

It is noted that the diplexer function is to provide both high band and low band signals. Here an input 30 is coupled to a low pass filter 64 comprised of inductors 50 and 52 and capacitor 54, with capacitor 54 coupled between the junction of inductors 50 and 52 to ground. The high-pass section of this diplexer is comprised of capacitors 56 and 58, with an inductor 60 coupled between the junction between these capacitors and ground. This high pass filter is shown at 66.

Figure 7:
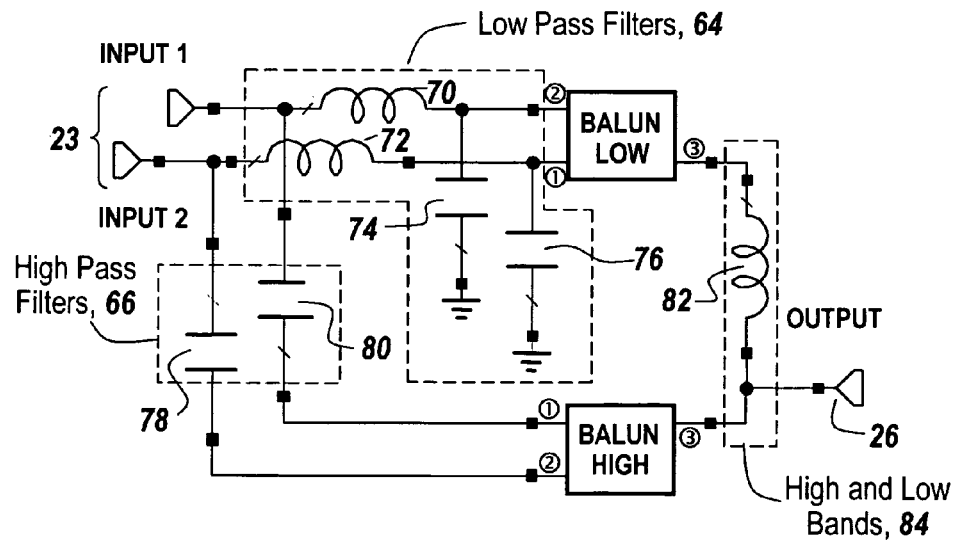
FIG. 7 is a schematic diagram of a simplified circuit for the FIG. 4B bal-plex balun in which the diplexers have been replaced with equivalent filter elements.

Referring now to FIG. 7, in one implementation of the subject bal-plex balun, it is possible to eliminate the diplexers and replace them with high and low pass filters, as illustrated. The circuit of FIG. 7 eliminates the diplexer in FIG. 6 by supplying two equivalent high pass and low pass filters, while at the same time providing an LC circuit, a portion of which includes an inductor 82, which is a part of the low pass filter at the output. Note that the diplexer at the outputs of baluns 42 and 44 is replaced with a low pass filter at the output of balun 42, including inductor 82, whereas the high frequency band comes directly out of balun 44. As will be seen, the high band and low bands are combined at 84 to provide a full bandwidth output 26.

The elimination of the diplexers is accomplished through a microwave design called parasitic absorption, where some of the behavior of the circuit is implicit in the circuit that one wants to match with.

Note that in terms of the output circuit, parasitic absorption results in only a single inductor, namely inductor 82. Thus, out of the six original components, five of them have been eliminated because of pre-existing behavior in the low band and high band baluns. Thus, for a balanced input, the diplexers that would normally be utilized to separate out the signals into a high frequency band and a low frequency band are replaced with circuit elements constituting a low pass filter and a high pass filter, here respectively 64 and 66.

Note that the pair of low pass filters 64 is comprised of inductors 70 and 72 and capacitors 74 and 76, whereas the pair of high pass filters 66 is comprised of capacitors 78 and 80. Note also that inductors 70 and 72 are series inductors, which are part of the low pass filter structure, with capacitors 74 and 76 acting as shunt capacitors.

Likewise for the high pass filters 66, capacitors 78 and 80 being series-oriented are high-pass elements and are part of the high pass filter structure that duplicates the high pass side of the diplexer going into the high frequency band balun 44.

As a result, the two diplexers that are used at the front end of the bal-plex balun are simplified with this methodology.

The output of the bal-plex balun substitutes for the diplexer associated with the output of a simplified circuit using only one low pass element, inductor 82. This element indicates a simplified equivalent circuit for the low pass behavior.

Figure 8:
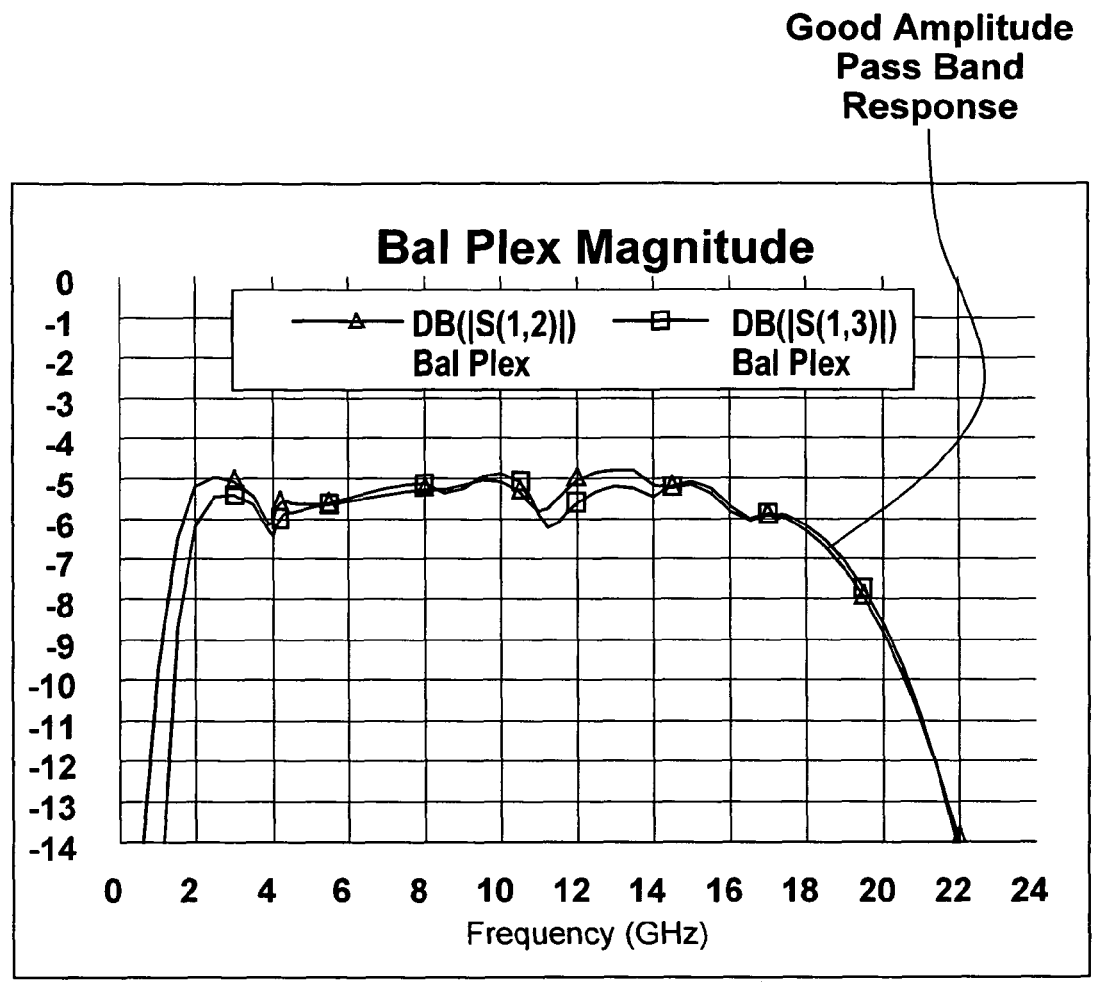
FIG. 8 is a graph showing the bal-plex amplitude response versus frequency, showing the outputs of the high and low frequency band baluns to be substantially uniform over the frequency range of interest.

It is noted that in FIG. 8, in which the bal-plex magnitude for each of the high frequency band and low frequency band components has an amplitude response that tracks very closely between the two sides of the balun, namely over a decade bandwidth extending from about 2 Gigahertz to 20 Gigahertz. Thus, what is shown in the FIG. 8 graph is a good amplitude pass band response over a decade bandwidth.

Figure 9:
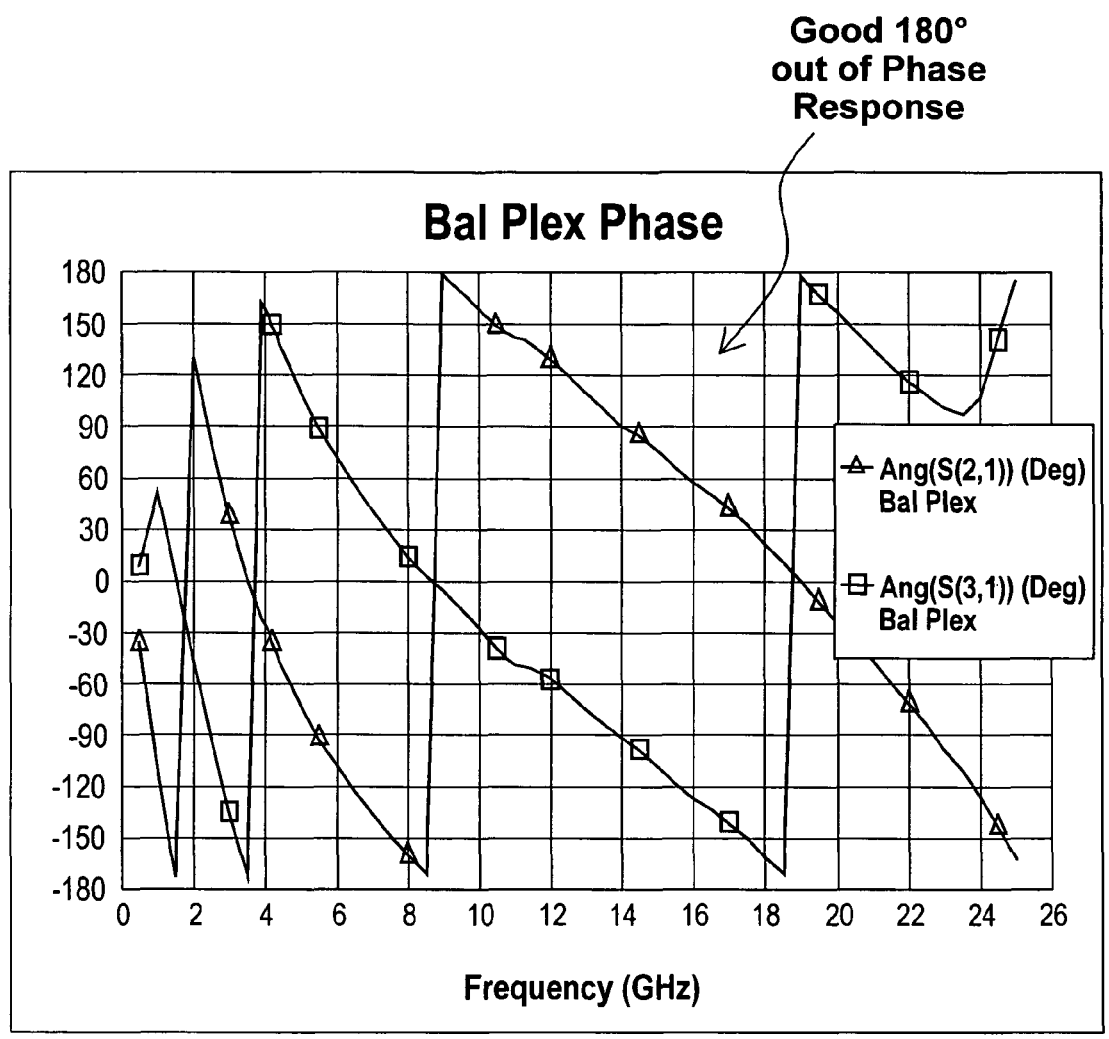
FIG. 9 is a graph showing the bal-plex phase for the high frequency and low frequency band baluns, indicating the 180-degree phase relationship between the outputs of the two baluns; and, FIG. 10 is a microphotograph of a MMIC implementation of the subject balun corresponding to the schematic diagram of FIG. 7.

With respect to the bal-plex phase graph of FIG. 9, it will be seen that there is good 180-degree out-of-phase response for each of the balanced outputs in which, for the same signal, the phase of the two divided-out signals track in phase such that the signals are very close to being exactly 180 degrees out of phase.

Figure 10:
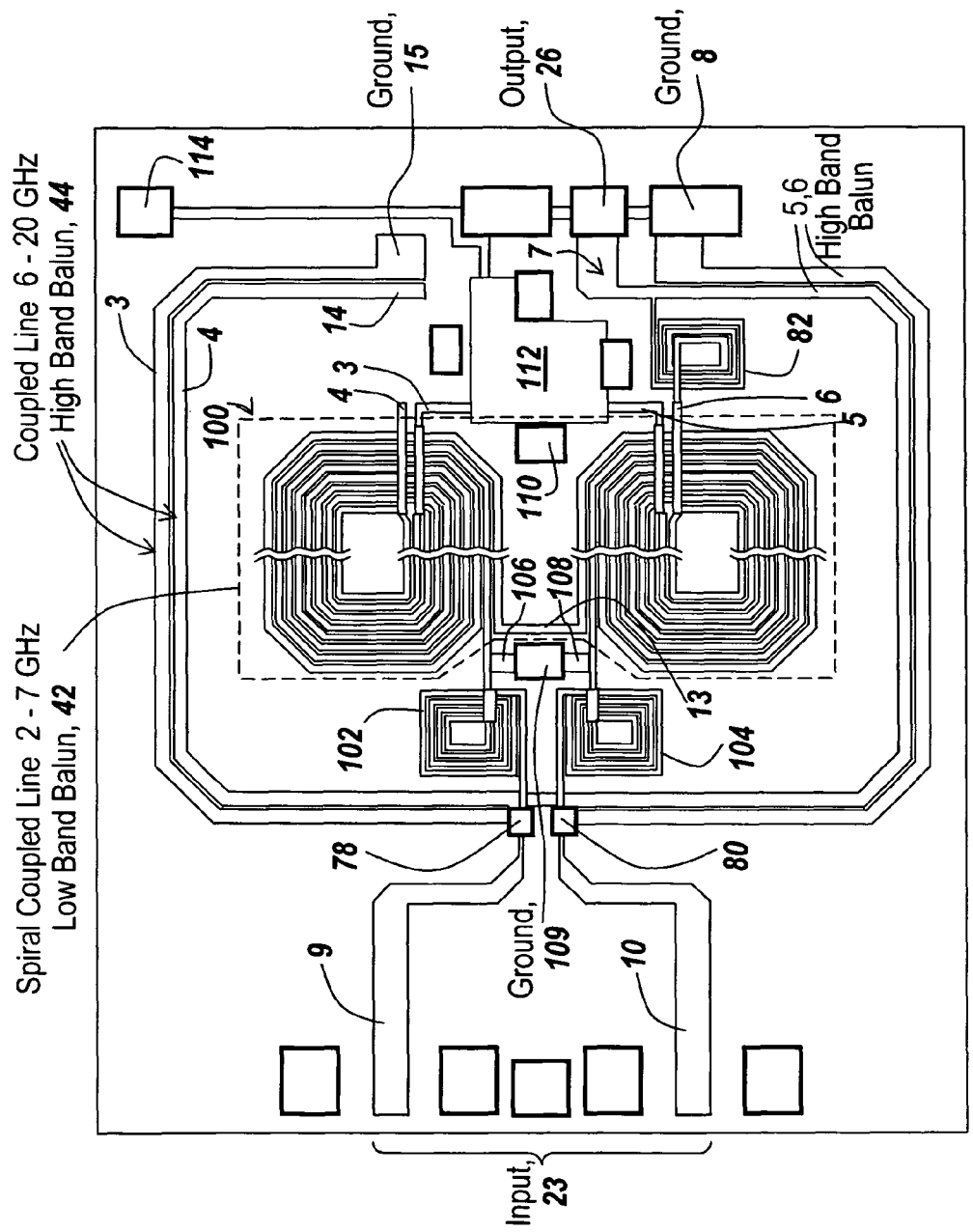

Referring now to FIG. 10, in one embodiment of a MMIC that performs a bal-plex function there is a spiral coupled Marchand-type low band balun 42, which functions between 2 and 7 Gigahertz, comprised of spiral lines 3 and 4 and spiral lines 5 and 6, with coupling 13 between the lines 4 and 5, corresponding to the corresponding components illustrated in FIG. 2.

The high frequency band balun is comprised of lines 3 and 4 and lines 5 and 6 corresponding to the corresponding components illustrated in FIG. 2 to give a coupled line balun with 6 to 20 Gigahertz high frequency bandwidth. Note that like reference characters correspond to like elements between FIGS. 2 and 10. Note also that spiral lines 102 and 104 correspond to inductor 50 of FIG. 6, and likewise to inductors 70 and 72 in FIG. 7. Capacitors 106 and 108 correspond to capacitor 54 in FIG. 6, and likewise to capacitors 74 and 76 in FIG. 7. Here, capacitors 78 and 80 and inductor 82 correspond to the equivalent capacitors and inductor in FIG. 7. Note that line 3 in FIG. 10 is grounded at ground 15 for the high frequency band, whereas line 6 is grounded at ground 8 for the other side of the high frequency band balun. Note that capacitor 112 is a large-area capacitor that provides RF grounding to all frequencies of interest. If biasing is required for preamplifiers or other amplification stages coupled to the bal-plex balun, DC coupling is provided from bias point 114 to 23.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A wide bandwidth microwave balun, comprising:
   a high frequency balun operating in a high frequency band;
   a low frequency balun operating in a low frequency band;
   a switchless circuit for dividing an input signal into a high frequency component and a low frequency component coupled to said high and low frequency baluns; and,
   a switchless combiner coupled to said high frequency balun and said low frequency balun for providing a full bandwidth output to offer wide bandwidth impedance matching and second-harmonic rejection.

2. The balun of claim 1, wherein said high frequency balun and said low frequency balun include balanced inputs, wherein said circuit for dividing an input signal into a high frequency component and a low frequency component includes a low pass filter and a high pass filter having respective outputs containing said high frequency and low frequency components coupled to balanced inputs of respective high frequency and low frequency baluns.

3. The balun of claim 2, wherein said filters include a pair of diplexers, each coupled to a different balanced input line, with the outputs of said diplexers containing said high frequency and low frequency components.

4. The balun of claim 1, wherein said low frequency balun includes a single-sided low frequency signal output, wherein said high frequency balun includes a single-ended high frequency signal output, and wherein said combiner combines the single-ended low frequency signal from said low frequency balun and the single-ended high frequency signal from said high frequency balun to produce an unbalanced full bandwidth signal output.

5. The balun of claim 4, wherein said combiner includes a diplexer.

6. The balun of claim 5, wherein said diplexer has two inputs, one input connected to said single-ended low frequency signal and the other of said inputs coupled to said single-ended high frequency signal.

7. The balun of claim 6, wherein said diplexer includes an unbalanced output.

8. The balun of claim 1, wherein said input signal is unbalanced and wherein said circuit for dividing said unbalanced input signal includes a filter for dividing said unbalanced input into two frequency bands, including a single-ended low frequency signal in one band and a single-ended high frequency signal in the other of said bands.

9. The balun of claim 8, wherein said single-ended low frequency signal and said single-ended high frequency signal are coupled to the unbalanced input of respective low frequency and high frequency baluns.

10. The balun of claim 9, wherein said low frequency balun and said high frequency balun have balanced outputs, the balanced output of said high frequency balun and said low frequency balun including a high frequency component and a low frequency component, and wherein said high frequency component and said low frequency component from said high frequency and low frequency baluns are combined to provide one full bandwidth signal.

11. The balun of claim 10, wherein said combiner includes a pair of diplexers.

12. The balun of claim 8, wherein said filter includes a diplexer.

13. The balun of claim 1, wherein said high frequency and low frequency baluns have balanced inputs, wherein said input signal is balanced, and wherein said circuit for dividing said balanced input signal includes a low pass filter connected between said balanced input and the balanced input of said low frequency balun, and a high pass filter coupled between said balanced input and the balanced input of said high frequency balun.

14. The balun of claim 13, wherein said low pass filter includes an LC circuit.

15. The balun of claim 13, wherein said high pass filter includes a capacitor.

16. The balun of claim 13, wherein the output of said low frequency balun is coupled to the output of said high frequency balun through a low pass filter.

17. The balun of claim 16 wherein said low pass filter coupled to the output of said low frequency balun includes an inductor.

18. The balun of claim 1, wherein said low frequency balun includes two pairs of spiral-wound lines connected so as to provide a Marchand balun.

19. The balun of claim 18, wherein said high frequency balun includes two pairs of lines to form a Marchand balun.

20. A method for providing a wide bandwidth microwave balun, comprising the steps of:

switchless coupling an input signal split into a high frequency band and a low frequency band respectively to a high frequency balun and a low frequency balun; and, switchless combining the outputs of the high frequency and low frequency baluns to provide a full bandwidth output and a wide bandwidth impedance matching function, whereby the bandwidth of the high frequency balun is added to the bandwidth of the low frequency balun to provide a full bandwidth combining the bandwidths of the high frequency balun and the low frequency balun.

21. The method of claim 20, wherein the bandwidth of the balun has a 10:1 ratio.

* * * * *